(12) United States Patent
Yun

(10) Patent No.: US 8,488,383 B2
(45) Date of Patent: Jul. 16, 2013

(54) NONVOLATILE MEMORY APPARATUS

(75) Inventor: In Suk Yun, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 200 days.

(21) Appl. No.: 13/174,820

(22) Filed: Jul. 1, 2011

(65) Prior Publication Data

US 2012/0002480 A1 Jan. 5, 2012

(30) Foreign Application Priority Data

Jul. 2, 2010 (KR) ........................ 10-2010-0063760

(51) Int. Cl.
*G11C 16/04* (2006.01)
(52) U.S. Cl.
USPC .................. 365/185.18; 365/189.05; 365/198
(58) Field of Classification Search
USPC ............. 365/185.18, 185.23, 185.12, 189.03, 365/189.17, 189.05, 201, 230.06, 230.08
See application file for complete search history.

(56) References Cited

U.S. PATENT DOCUMENTS

| 6,779,139 B2 * | 8/2004 | Haraguchi et al. ............ 714/718 |
| 6,996,027 B2 * | 2/2006 | Shin .......................... 365/185.17 |
| 2011/0235459 A1 * | 9/2011 | Ware et al. ................ 365/233.11 |

FOREIGN PATENT DOCUMENTS

| KR | 10-0666013 B1 | 1/2007 |
| KR | 100743494 B1 | 7/2007 |

\* cited by examiner

*Primary Examiner* — Gene Auduong
(74) *Attorney, Agent, or Firm* — William Park & Associates Patent Ltd.

(57) ABSTRACT

A nonvolatile memory device includes: a data transmission line configured to transmit internal configuration data; a data path control unit configured to control a data transmission path direction of the data transmission line according to control of a test signal; and a configuration data latch unit configured to latch a signal transmitted through the data transmission line or drive a latched signal to the data transmission line, according to control of the test signal.

12 Claims, 1 Drawing Sheet

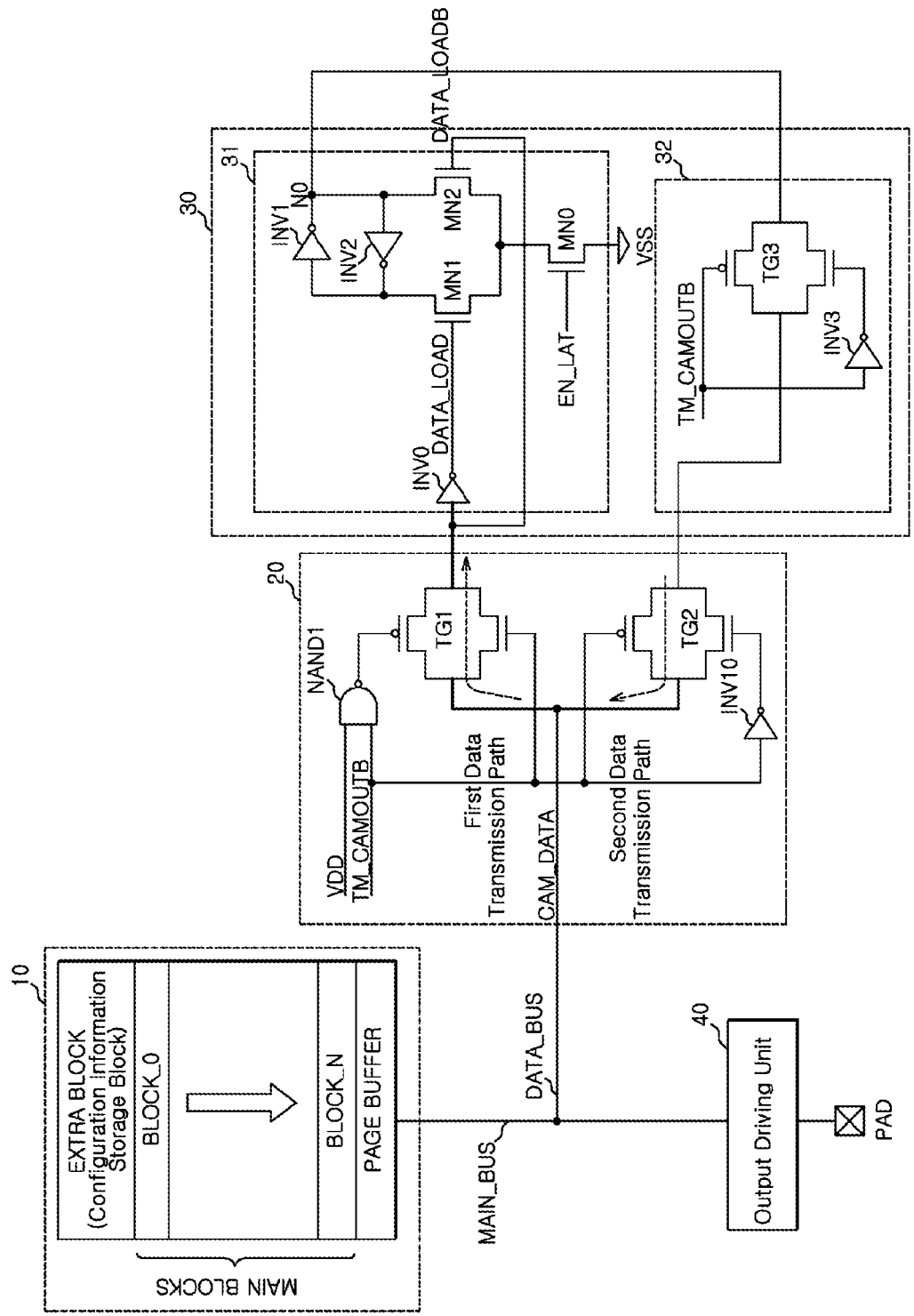

NONVOLATILE MEMORY APPARATUS

CROSS-REFERENCES TO RELATED APPLICATION

The present application claims priority under 35 U.S.C. §119(a) to Korean application number 10-2010-0063760, filed on Jul. 2, 2010, in the Korean Intellectual Property Office, which is incorporated herein by reference in its entirety.

BACKGROUND

1. Technical Field

The present invention relates generally to a nonvolatile memory apparatus, and more particularly, to a technology for outputting a signal stored in a configuration data latch.

2. Related Art

A non-volatile memory apparatus such as a flash memory maintains a plurality of internal configuration data for purposes of apparatus configuration and others. A configuration information storage block is allocated to a specific block of memory unit (i.e., a plurality of non-volatile memory cells) for storing the plurality of internal configuration data. Such a configuration information storage block may be referred to as a code address memory (CAM).

The plurality of internal configuration data stored in the configuration data storage block may include internal bias information, internal logic configuration information, fail address information, redundancy information and so on. During a power-up period, power is applied to a nonvolatile memory device to perform power resetting. During this period, the internal configuration data stored in the configuration data storage block are sensed and outputted through a page buffer of the memory block. The signals outputted from the page buffer are then stored in a latch for use in its internal logic operations.

SUMMARY

A nonvolatile memory apparatus capable of outputting a signal stored in a configuration data latch to the outside is described herein.

In an embodiment of the present invention, a nonvolatile memory device includes: a data transmission line configured to transmit internal configuration data; a data path control unit configured to control a data transmission path direction of the data transmission line according to control of a test signal; and a configuration data latch unit configured to latch a signal transmitted through the data transmission line or drive a latched signal to the data transmission line, according to control of the test signal.

BRIEF DESCRIPTION OF THE DRAWINGS

Features, aspects, and embodiments are described in conjunction with the attached drawing, in which FIG. 1 illustrates a nonvolatile memory device according to an embodiment of the present invention.

DETAILED DESCRIPTION

Hereinafter, a nonvolatile memory apparatus according to the present invention will be described below with reference to the accompanying drawings through exemplary embodiments.

FIG. 1 illustrates a nonvolatile memory device according to an embodiment of the present invention.

The present disclosure includes various aspects of the nonvolatile memory device according to an embodiment of the present invention.

Referring to FIG. 1, the nonvolatile memory device includes, inter alia, a memory unit 10, a data transmission line DATA_BUS, a data path control unit 20, a configuration data latch unit 30, and an output driving unit 40.

The memory unit 10 includes a plurality of main storage blocks BLOCK_0 to BLOCK_N, an extra storage block EXTRA BLOCK, and a page buffer PAGE BUFFER. Each of the main storage blocks BLOCK_0 to BLOCK_N are divided into a plurality of pages, and each of the pages includes a plurality of memory cells. The extra storage block EXTRA BLOCK includes a configuration information storage block for storing a plurality of internal configuration data CAM_DATA. The configuration information storage block is divided into a plurality of pages, and each of the pages includes a plurality of memory cells. The page buffer PAGE BUFFER is configured to sense and output the configuration data CAM_DATA stored in the configuration information storage block and the main storage blocks. The plurality of internal configuration data CAM_DATA may include internal bias information, internal logic information, fail address information, and redundancy information, among others.

The data transmission line DATA_BUS is configured to transmit the internal configuration data CAM_DATA outputted from the memory unit 10.

The data path control unit 20 is configured to control the data transmission path of the data transmission line DATA_BUS in response to a test signal TEST_CAMOUTB. For example, the data path control unit 20 according to an embodiment of the present invention as shown in FIG. 1 is configured to control the data transmission path of the internal configuration data CAM_DATA through the data transmission line DATA_BUS to either the first or is the second data transmission path. That is, referring to Table 1, the data path control unit 20 enables a first data transmission path when the test signal TEST_CAMOUTB is deactivated to a high level, and enables a second data transmission path when the test signal TEST_CAMOUTB is activated to a low level. The test signal TEST_CAMOUTB may be a signal directly inputted from outside in a test mode. Alternatively, the test signal TEST_CAMOUTB may be a signal generated from an internal test control logic or an internal control circuit.

TABLE 1

| Test Signal TM_CAMOUTB | Data Path Control Unit 20 | Switching Section | Configuration Data Latch Unit 30 |
|---|---|---|---|
| Deacivated (High) | Enables First Data Transmission Path | TG1 Turns on | Latches signal of the first transmission line of DATA_BUS |
| Activated (Low) | Enables Second Data Transmission Path | TG2 Turns on | Drives latched signal to the second transmission line of DATA_BUS |

In an embodiment of the present invention, the data path control unit 20 includes a plurality of switching sections TG1 and TG2 and is configured to operate with the data transmission line DATA_BUS. The switching sections TG1 and TG2 include transmission gates and selectively turn on under the control of the test signal TEST_CAMOUTB. When the test signal TEST_CAMOUTB is deactivated to a high level, the first switching section TG1 is turned on to form the first data transmission path. Furthermore, when the test signal TEST_CAMOUTB is activated to a low level, the second switching section TG2 is turned on to form the second data transmission path.

The configuration data latch unit 30 is configured to latch a signal transmitted through the data transmission line DATA_BUS or to drive a latched signal to the data transmission line DATA_BUS according to the control of the test signal TEST_CAMOUTB.

In an embodiment of the present invention, the configuration data latch unit 30 latches a signal transmitted through the first data transmission path of the data transmission line DATA_BUS when the test signal TEST_CAMOUTB is deactivated to a high level, and drives a latched signal to the second data transmission path of the data transmission line DATA_BUS when the test signal TEST_CAMOUTB is activated to a low level. The configuration data latch unit 30 includes a cross-coupled latch amplification section 31 and a switching section 32. The cross-coupled latch amplification section 31 is configured to sense and latch signals DATA_LOAD and DATA_LOADB inputted in response to a latch enable signal EN_LAT. The cross-coupled latch amplification section 31 includes a cross-couple type differential amplification circuit. The switching section 32 is configured to selectively output the signals is latched in the cross-coupled latch amplification section 31 according to the control of the test signal TEST_CAMOUTB.

The output driving unit 40 is configured to drive a signal outputted from the data latch unit 30 and transmitted through the second data transmission path of the data transmission line DATA_BUS, to an output pad PAD when the test signal TEST_CAMOUTB is activated.

As described above, the nonvolatile memory device in accordance with an embodiment of the present invention may directly output the internal configuration data CAM_DATA stored in the configuration data latch unit 30 to the outside through the control of the test signal TEST_CAMOUTB. Therefore, the internal bias information, the internal logic configuration information, the fail address information, the redundancy information or the like may be directly outputted to the outside and then analyzed in the test mode, if necessary. Therefore, test efficiency is improved.

The embodiments of the present invention have been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. Since these circuit changes have a large number of cases and can be easily inferred by those skilled in the art, the is enumeration thereof will be omitted herein.

While certain embodiments have been described above, it will be understood to those skilled in the art that the embodiments described are by way of example only. Accordingly, the nonvolatile memory device described herein should not be limited based on the described embodiments. Rather, the nonvolatile memory device described herein should only be limited in light of the claims that follow when taken in conjunction with the above description and accompanying drawings.

What is claimed is:

1. A memory device comprising:
   a data transmission line comprising a plurality of data transmission paths and capable of transmitting internal configuration data through the plurality of data transmission paths;
   a data path control unit configured to control a data transmission path direction of the data transmission line in response to a test signal; and
   a configuration data latch unit configured to latch a signal transmitted through the data transmission line or to drive a latched signal to the data transmission line in response to the test signal.

2. The memory device according to claim 1, further is comprising a memory unit comprising a configuration information storage block configured to store the internal configuration information.

3. The memory device according to claim 2, wherein the configuration information storage block is configured with a plurality of pages, each page comprising a plurality of nonvolatile memory cells.

4. The memory device according to claim 2, wherein the memory unit comprises:
   a main storage block;
   a configuration information storage block being a non-main storage memory block having the internal configuration data stored therein; and
   a page buffer configured to sense and output data stored in the configuration information storage block and the main storage block.

5. The memory device according to claim 4, wherein the internal configuration data comprises one or more of: internal bias information, internal logic configuration information, fail address information, and redundancy information.

6. The memory device according to claim 1, further comprising an output driving unit configured to drive a signal outputted from the configuration data latch unit to an output pad in response to the test signal.

7. The memory device according to claim 1, wherein the internal configuration data comprises one or more of: internal bias information, internal logic configuration information, fail address information, and redundancy information.

8. The memory device according to claim 1, wherein the configuration data latch unit latches a signal transmitted through the data transmission line in response a first state of the test signal, and drives a latched signal to the data transmission line in response to a second state of the test signal.

9. The memory device according to claim 1, wherein the test signal is deactivated in the first state and activated in the second state.

10. The memory device according to claim 1, wherein the data path control unit operably connected to the plurality of data transmission paths of the data transmission line comprises: a plurality of switching sections configured to be operated to selectively control the data transmission paths in response to the test signal.

11. The memory device according to claim 1, wherein the configuration data latch unit comprises:
    a cross-coupled latch amplification section configured to sense and latch an inputted signal; and
    a switching section configured to selectively output the signal latched in the cross-coupled latch amplification section in response to the test signal.

12. The memory device according to claim 1, wherein the memory device is a non-volatile memory device comprising a flash memory.

* * * * *